United States Patent [19]

Gale

[11] 4,110,684

[45] Aug. 29, 1978

[54] METHOD OF DETECTING FAULTS ON LOW VOLTAGE DISTRIBUTION ELECTRIC CABLES UTILIZING A PLURALITY OF TRANSIENT RECORDERS

[75] Inventor: Philip Franklin Gale, Mold, Wales

[73] Assignee: The Electricity Council, England

[21] Appl. No.: 779,435

[22] Filed: Mar. 21, 1977

[30] Foreign Application Priority Data

Mar. 22, 1976 [GB] United Kingdom ............... 11484/76

[51] Int. Cl.² ...................... G01R 31/08; G01R 19/16
[52] U.S. Cl. ....................................... 324/52; 324/102
[58] Field of Search .................... 324/51, 52, 102, 112, 324/113; 179/175.3 F

[56] References Cited

U.S. PATENT DOCUMENTS

| | | | |
|---|---|---|---|
| 3,633,101 | 1/1972 | Johnson | 324/102 |
| 3,662,380 | 5/1972 | Cargile | 324/112 UX |
| 3,771,049 | 11/1973 | Piccione | 324/51 |
| 3,816,815 | 6/1974 | Schumann | 324/112 |
| 3,836,851 | 9/1974 | Schumann | 324/112 |

OTHER PUBLICATIONS

Hedges, Charles P., Digital Recorder Holds Data After Shock, *Electronics,* Mar. 20, 1959, pp. 60–62.

*Primary Examiner*—Gerard R. Strecker
*Attorney, Agent, or Firm*—Beveridge, De Grandi, Kline & Lunsford

[57] ABSTRACT

For detecting faults on low voltage alternating current electric power distribution cables, recorders are provided, each triggered by a selected occurrence, e.g. a decrease in signal amplitude or a change in the waveform, to cease recording, after a short delay, of the waveform data in digital form, so that a store holds digital data enabling the waveform of the last few cycles covering the period before and after the selected occurrence. Using a voltage gradient technique analysis of the data enables the position of the fault to be located.

3 Claims, 9 Drawing Figures

FUSE INSERTED     FUSE RUPTURED

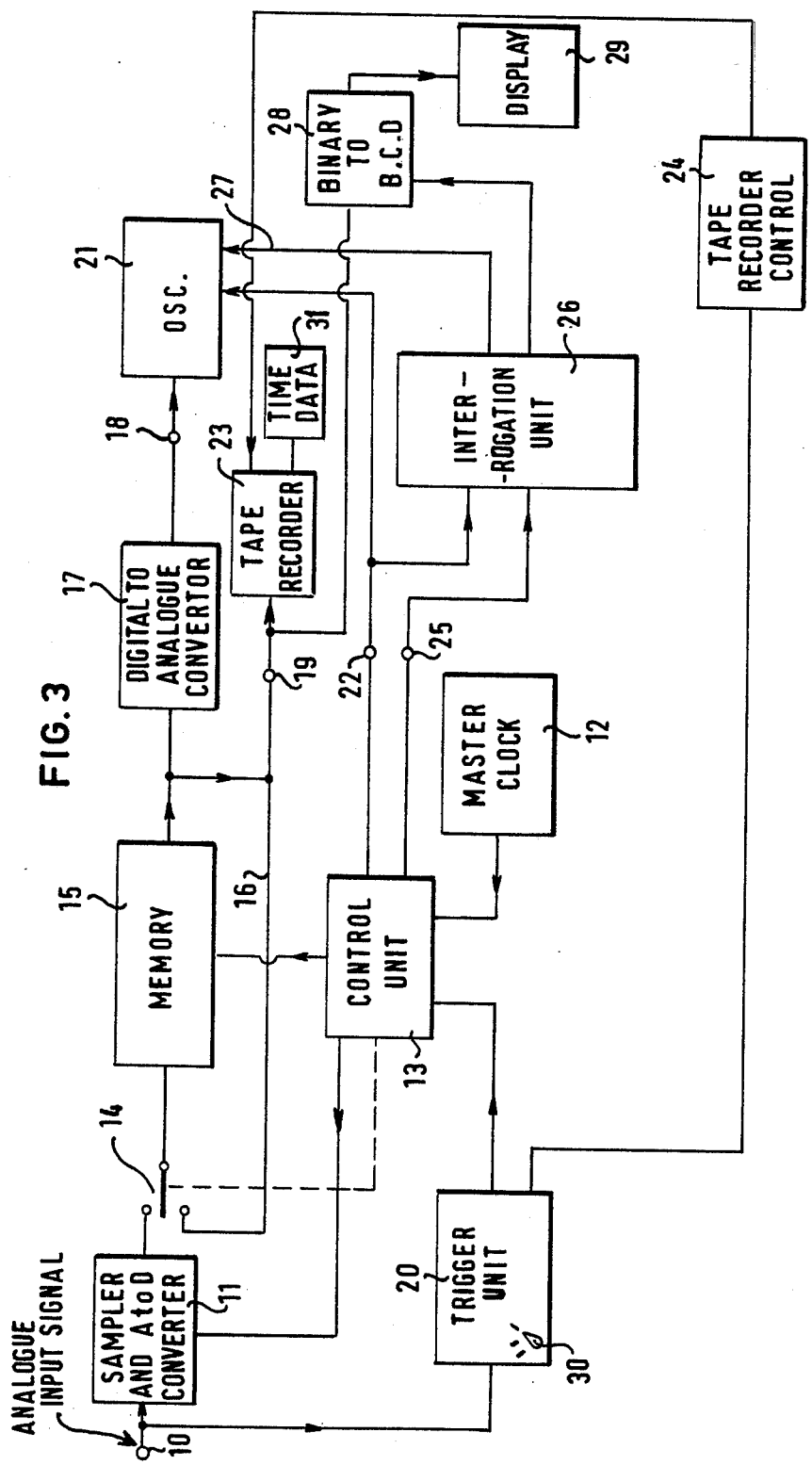

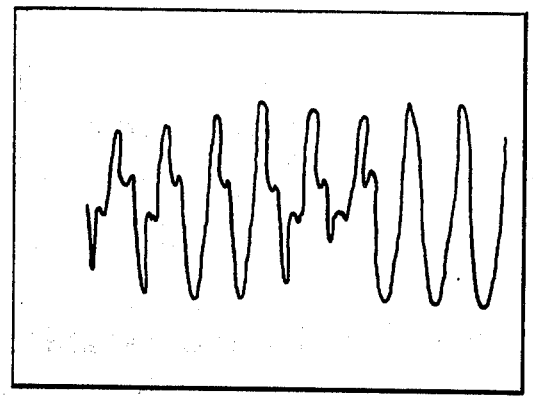
OFF to ON mode
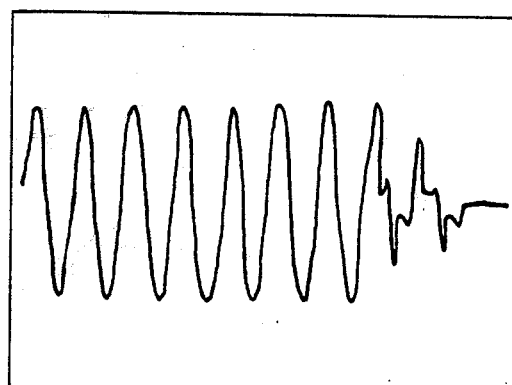
ON to OFF mode
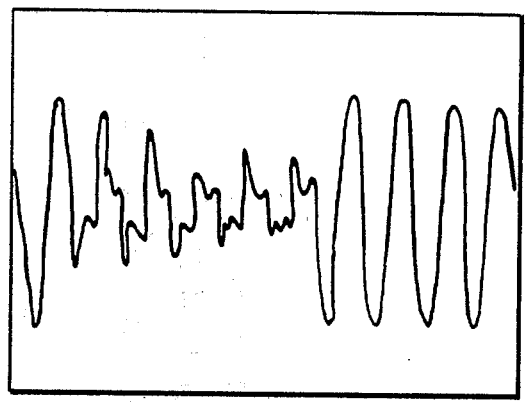
TRANSITORY mode

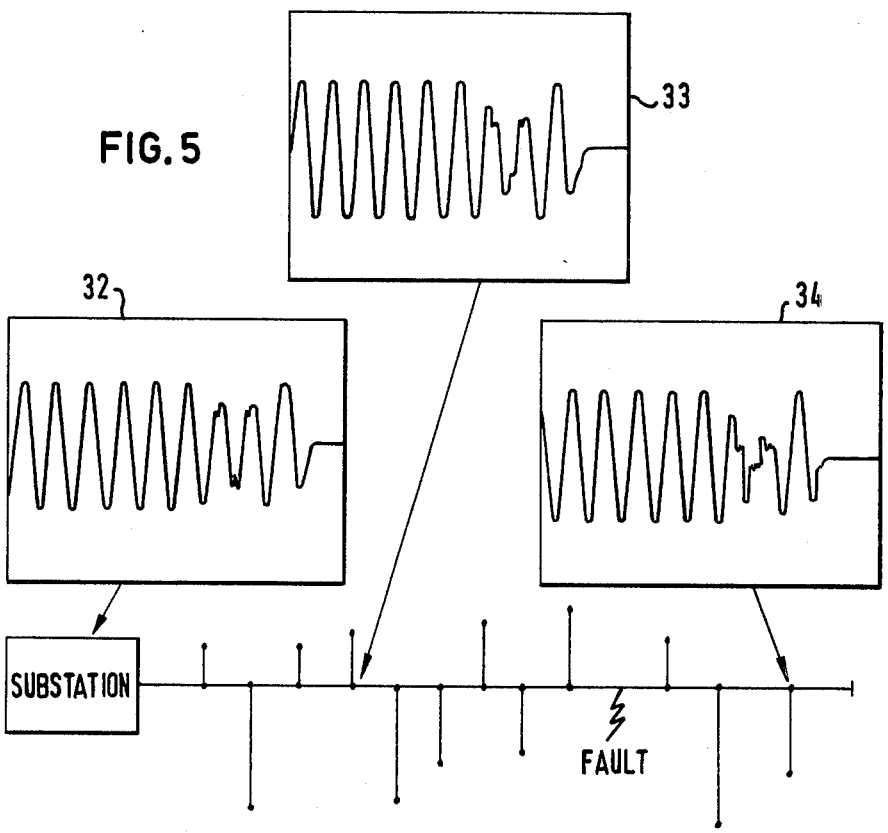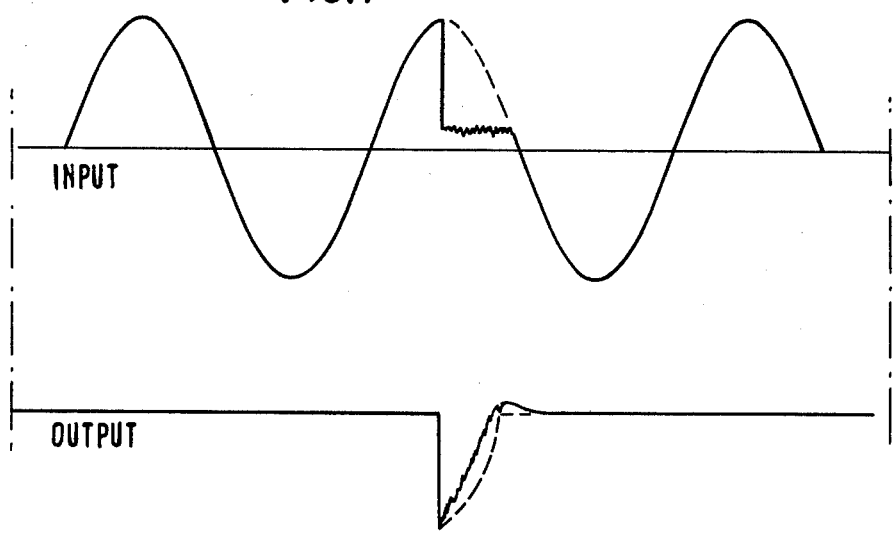

METHOD OF DETECTING FAULTS ON LOW VOLTAGE DISTRIBUTION ELECTRIC CABLES UTILIZING A PLURALITY OF TRANSIENT RECORDERS

BACKGROUND OF THE INVENTION

This invention relates to the detection of faults on low voltage distribution cables carrying low frequency alternating electric current. It is particularly applicable to low voltage distribution cables in a power supply system.

Low voltage cable faults can be divided into three groups, — transitory, non-persistent and permanent. It is believed that many faults appear initially as transitory faults, develop into non-persistent faults and finally become permanent faults. Until a fault has developed into the non-persistent state its existence is normally not suspected. Locating non-persistent faults presents great difficulty at present.

Many faults on low voltage cables are attributable to mechanical failure of the outer metallic sheath allowing moisture to penetrate into the insulation. The mechanical failure may occur as a result of deterioration due to ageing, but more commonly is the result of accidental contact during excavation work in the vicinity of the cable. The damage frequently is insufficient to cause the circuit protection, e.g. circuit breakers or fuses, to operate and therefore, unless the cable is subsequently exposed and the damage observed, many cables lie in the ground with the damage to their sheaths undetected. If the metal sheath of a cable is broken, it is usually only a matter of time before moisture begins to penetrate into the insulation and, in the case of paper insulated cables, a transitory fault appears.

During the transitory stage of the development of a cable fault, the moisture entering the cable increases the dielectric loss in the insulation adjacent to the point where the sheath is damaged, eventually resulting in breakdown when the critical point is reached where thermal runaway occurs. The breakdown normally results in an arc which lasts typically less than 5ms. During the arcing period, there is typically a voltage of 100 to 200 volts across the fault causing a transient disturbance in the waveform. The arc is extremely violent and removes, or dries out, the faulty insulation and vaporises some material from both the core and sheath of the cable. The insulation is now effectively sound and able to withstand normal supply voltage, and the arc after becoming deionised during the current zero does not restrike. Unless the fault level at the point of breakdown is fairly high, it is unlikely that the circuit fuse will operate and the transitory fault will occur unnoticed, — except, possibly, for a slight dip in the lights.

The explosive and thermal energy liberated at the fault causes an increase in the extent of the sheath damage, thereby allowing moisture to penetrate more easily into the cable and precipitate further transitory breakdowns. The time interval between successive transitory breakdowns tends to decrease as the amount of sheath damage increases, and eventually enough insulation may be degraded by the moisture for the energy in one half-cycle to be insufficient to clear the debris completely, and breakdown will then occur on successive half cycles at a progressively reducing voltage.

Subject to fault levels and fuse characteristics, there will now be the possibility of a "fuse clearance" resulting in a non-persistent fault, — that is a fault where supplies can be restored immediately by replacing the fuse. In some cases "fuse clearance" may not occur until the fault has developed further and the discontinuous arc has been replaced by an almost continuous a.c. arc, or even until ohmic conduction has commenced. The operation of a fuse in the later stages of the development of a fault does not necessarily mean that a permanent fault condition has developed, although once ohmic conduction occurs successful restoration of the supply to consumers by fuse replacement is unlikely, since in all probability the insulation will either be heavily carbonised or else a metal to metal weld will have formed. During the development of a fault it is possible that sufficient material may be removed for the faulty core to become open circuited, in which case the fault can be located relatively easily.

If a fault develops into a permanent short circuit fault there are a number of ways of locating it. In one technique, known as the Transgradient method (see British Pat. Specification No. 1140446), the peak voltages at various points along a cable are measured and recorded when fault current is flowing. The method is extremely useful for locating premanent faults, but if the fault exhibits any of the characteristics of a non-persistent fault, that is of non-sinusoidal current flow, the results will be unsatisfactory. To locate non-persistent faults, or to eliminate the possibility of error in locating unstable permanent faults, the measuring units are connected in the "sheath gradient mode". This connection involves the use of an auxiliary reference conductor which may be the street lighting core in a 5 core cable, but more often is a separate temporary overground wire.

SUMMARY OF THE INVENTION

The present invention is concerned with the detection of faults whether transitory, non-persistent or permanent, on conventional four or five core cables and enables faults to be located without the use of any auxiliary conductors; it is suitable also for use on p.m.e. (protective multiple earthed) cables. Location of non-persistent faults on p.m.e. cables is of particular importance since many of the p.m.e. cables now being used employ polymeric insulation in place of the impregnated paper of conventional cables, and there is a widespread belief that such cables will be more susceptible to transitory and non-persistent faults.

According to one aspect of the present invention, there is provided apparatus for recording digital data representing the waveform of the alternating signal on a power distribution cable, said apparatus comprising a battery-powered digital transient recorder having a digital signal store, means for regularly repetitively sampling the waveform to be recorded, analogue to digital conversion means arranged to convert the sampled signal amplitudes into digital form, means for feeding the digitised sampled signal amplitudes into said digital signal store for recording the most recent digitised sampled information, and means responsive to a change in the amplitude and/or waveform of the waveform to be sampled operative to stop further recording when such a change in amplitude or waveform occurs.

Such apparatus with a battery powered transient recorder may readily be connected to a distribution cable, for example by plugging into a socket outlet in a consumer's premises and will serve to record the waveform of the supply immediately before and during the fault. Typically the store is arranged to hold only the digital data relating to a few cycles at the supply frequency, old data being removed as new data is written in. Conveniently the store is arranged to store information relating to at least five cycles and, typically, to store information relating to ten cycles of the alternating waveform. A short delay may be provided before recording ceases so as to complete the record of the waveform for a time extending to slightly after the detection of the event triggering the cessation of recording. This recorder is independent of any power from the supply system for effecting the recording. A number of such recorders may be used set to be triggered to stop recording under corresponding conditions, e.g. a reduction or an increase in waveform amplitude or a waveform distortion. These may be connected to a cable at points along its length; the record itself then provides the necessary synchronising data enabling the waveforms at the different points to be compared.

It is convenient to provide selector means enabling any one of a number of different conditions to be selected to provide the trigger signal. For example, as one condition, the triggering may be set to operate the recorder to record a few cycles of waveform immediately after the power is applied to a cable. This form of recording could be used for a permanent fault where a fuse is ruptured only a short time after it is replaced. As a second condition, the triggering may be set to operate after a reduction in the voltage on the cable; this may be used with a non-persistent or intermittent fault where a fuse is ruptured some long time, possibly many hours, after it is replaced. In this condition, the recorder or a number of recorders may be connected to the cable when the latter is deenergised; the cable may then be energised and the recorder or recorders will operate and continue to operate until the supply fuse ruptures. The recorder or recorders will then cease recording but will carry a record of the last few cycles before the rupturing of the fuse.

The apparatus of the present invention is of particular value in the location of transitory faults. In such faults, the supply fuse may not rupture but there is a waveform distortion which can be detected and used to trigger the recorder or recorders.

Whenever a fault breaks down and causes current to flow along a cable there is a voltage gradient along the conductors through which the current flows. The voltage gradient is determined by the value of the current and the impedance of the cable. The current is governed by the impedance of the source, the impedance of the cable between the source and the fault point, and by the impedance, or arc voltage, of the fault. Different voltage waveforms are thus obtained at different points along a cable. If the instantaneous values of voltage at a number of measuring points are plotted on a graph with an abscissa which represents impedance (in practice, the abscissa represents distance, equivalent lengths being used if more than one cross-section or cable type is involved), it is found, as will be explained in more detail later, that the readings lie on two straight lines which intersect at the point of the fault.

The present invention makes use of a system of measurement which can effectively look for differences in the voltages which appear at points on a cable. It is thus possible to locate faults by recording the phase to earth voltages. Provided all the measurements can be synchronised, and if instantaneous, rather than peak, voltages are recorded, it is possible to locate transitory faults which only last a few milliseconds. It will be appreciated that this can be achieved by the above-described apparatus.

Means may be provided for reading out the recorded data from said store and recording it on magnetic tape, e.g. using a cassette tape recorder, to facilitate subsequent analysis.

Preferably means are provided for repetitively reading out the data in said store and an oscilloscope is arranged for displaying the read-out data as a reconstituted analogue display. The appearance of the waveform, as will be hereinafter explained, can provide information about the nature and position of the fault. An interrogation unit may be coupled to said store and to said display, this unit being arranged for reading out any selected amplitude data from the store and for simultaneously setting a marker on the oscilloscope display in a position corresponding to the selected data.

In employing this apparatus, the waveform may be recorded at different points along a power distribution cable for subsequent analysis. It is convenient to make simultaneous recordings of the same event for comparison of the waveforms. As explained above, this enables a fault to be located using a voltage gradient technique by comparison of simultaneous amplitudes at different points during the flow of fault current.

According to another aspect of this invention, a method of detecting a transitory or non-persistent fault in an electric cable carrying a low frequency electric current comprises, at each of a number of spaced points along the cable, sensing the transient changes in the voltage waveform between a pair of conductors using a filter for rejecting said low frequency, and utilising the sensed transient to trigger a transient recorder to record the voltage on said cable, the recorder including an analogue-to-digital converter and having means for holding the digital output.

According to yet another aspect of the invention, apparatus for detecting a transitory or non-persistent fault in an electric cable carrying a low frequency alternating current comprises a number of battery-powered units, each for connecting to two conductors of the cable, each unit comprising sampling means sampling the waveform amplitude at a repetition rate substantially greater than said low frequency, an analogue-to-digital converter converting the sampled signal amplitudes to digital form, a store for storing the most recent digitised sample values, and a control circuit operative, on receipt of a trigger signal, to cause the store to hold the sampled values and means for producing said trigger signal including a filter for rejecting said low frequency from the alternating waveform so as to provide a signal corresponding to transient differences from the low frequency waveform, together with means responsive to the initial edge of any output signal from the filter to generate the required trigger signal.

It will be noted that the above-described apparatus and method permits of fault location without having to "burn-out" the fault. This is a very important advantage as acoustic pinpointing of the fault position is still possible. This reduces the dependence on cable records and overcomes the problems of ambiguity on multi-branched networks. Acoustic pinpointing can only be done if the fault exhibits a non-linear arcing characteristic.

BRIEF DESCRIPTION OF THE DRAWINGS

FIG. 3 is a block diagram of a part of a battery-powered recorder;

FIG. 4 shows at (a), (b) and (c) waveform diagrams obtained with three different modes of operation;

FIG. 5 is a diagram showing voltage waveforms obtained at three points along a cable during a transitory fault;

FIG. 7 is a waveform diagram illustrating the action of a filter.

DESCRIPTION OF THE PREFERRED EMBODIMENT

Figure 1:
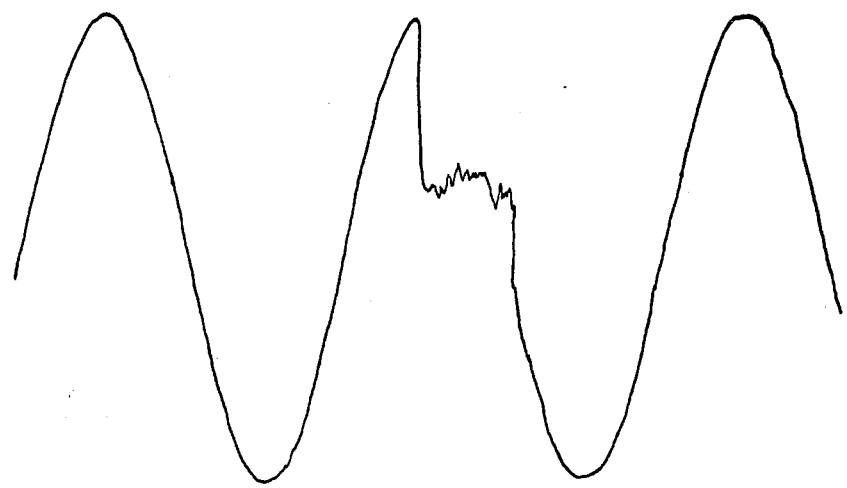
FIG. 1 is a waveform diagram showing the voltage across a typical transitory fault.

A transitory fault does not cause the circuit fuse to operate because it lasts for only a fraction of a cycle and also because the impedance of the arc formed at the fault limits the fault current. FIG. 1 shows the voltage waveform obtained across a typical transitory fault. Transitory faults generally occur unnoticed although they can produce very pronounced flicker on lighting.

Each time a transitory fault occurs the energy released tends to extend the region of damage thus allowing moisture to enter the cable more rapidly which, in turn, decreases the time before the next transitory fault occurs. Eventually the fault will become so extensive that transitory breakdowns may occur on a number of successive half cycles and it is at this stage that the circuit fuse may operate. Often the cable can be re-energised immediately with a replacement fuse, which may remain intact for some considerable time and the fault is then classed as a non-persistent fault. Several fuse operations may occur before the non-persistent fault becomes a permanent fault. Between successive fuse operations it has been found that transitory breakdowns continue to occur.

Once it becomes impossible to restore the supply to all the consumers normally fed from a cable the fault is classed as permanent. A permanent fault does not always cause the fuse to blow, for example if an open circuit develops on one or more conductors of a cable, nevertheless the consumers connected beyond the break point are isolated from their normal point of supply. Such faults are relatively easy to localise by deduction. A permanent fault may also result in the formation of a low resistance short circuit between two cores of a cable where a supply can be maintained to all single phase consumers, provided only one of the cores is re-energised directly by replacing the fuse in the substation. These core to core faults can be localised by deduction, if the phase of consumers' supplies are checked against records, and often they can be located precisely with induction fault locators.

Figure 2:
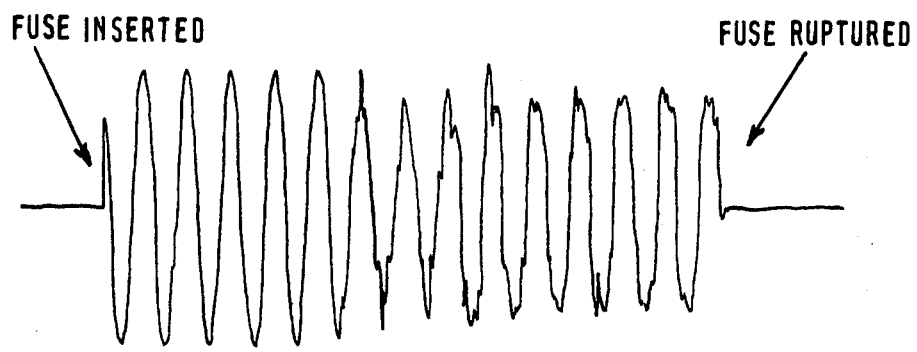
FIG. 2 is a waveform diagram showing the voltage on a cable at a substation during re-energisation of a cable by insertion of a fuse, the cable having a permanent fault causing rupturing of the fuse.

FIG. 2 shows the voltage waveform observed in a substation when a low voltage cable fault was re-energised. This fault would be described as permanent since the fuse only held for 14 cycles, however during this time the waveform clearly shows that the fault current was neither continuous nor sinusoidal. During the first 5 cycles there was no fault current at all then the fault broke down irregularly during the next 9 cycles before the fuse finally operated. This type of behaviour has been observed with the majority of the faults which have been studied and, therefore, the apparatus to be described has been designed to accommodate it.

The basis of the present method for locating transitory faults is the long established voltage gradient technique. The main difference between the present proposal and previous systems is the use of instruments which record the actual waveforms which appear at the various points along the cable. By recording complete waveforms it is possible to determine if and when the fault current was flowing so that voltage gradients can be obtained whether the fault exhibits a stable ohmic resistance or the more usual unstable arcing characteristic. Various types of instrument could be used for this purpose, either multi-channel units connected by long leads to the various test point or independent single channel units with some method of synchronising their recordings. There are also several possible recording methods, for example, ultra-violet chart recording, analogue magnetic tape recording, digital magnetic tape recording etc. The preferred method, however, is to use a number of independent digital recorders with semiconductor memories.

The instrument in a preferred embodiment utilises very low power CMOS devices and is operated from internal re-chargeable batteries. When the instrument is connected to an energised cable the batteries are trickle charged so that the stored data will remain valid for the maximum length of time if and when the supply fails. The basic schematic of the instrument is shown in FIG. 3. The analogue input signal at terminal 10 is sampled and digitised by a sampler and analogue-to-digital converter 11 at a sampling rate controlled by a clock 12 and control unit 13. The clock signal is derived from a stable crystal oscillator and is typically 5 kHz so that slightly more than 10 cycles of recording time can be stored in a 1024 word memory. From the unit 11, the digital data representative of the waveform is fed via a switching device 14 into a store 15. Typically eight parallel, 1024 bit shift registers are used to form a memory store of 1024, 8 bit, bytes. Larger memories providing longer and/or more accurate recordings might be used. An alternative to the shift register is a random access memory but this requires addressing logic and requires more power. The switch 14, operated by control unit 13 permits of information being fed into the store or of the existing information being re-circulated via a feed-back loop 16. The shift register memory store 15 is clocked at the sampling rate so that the stored information represents the last 10 cycles of waveform fed into the memory.

The output of the memory or store 15 is fed into a digital-to-analogue converter 17 so that a reconstituted analogue signal is available at an output terminal 18. The memory output is also available in digital form at an output terminal 19. Both analogue and digital outputs are available when the instrument is in the "recording" mode so that its operation can be monitored. When the instrument has been triggered by a trigger unit 20, to be described later, switching device 14 is operated so that the data in the memory 15 is re-circulated. The analogue output at terminal 18 gives a repetitive signal which can be viewed on an oscilloscope 21. The oscilloscope time base sweep is triggered by a synchronising pulse which occurs at the beginning of each cycle of output at terminal 18 and which is provided by the control unit 13 at a terminal 22. In order to avoid flicker on the oscilloscope display the clock rate for recycling the data in the memory 15, during read-out, is increased to 50 kHz.

The oscilloscope 21 is preferably an external oscilloscope separate from the recorder and with its own power supply circuit, rather than an internal display unit in each instrument, thus keeping the size and power consumption of the recording equipment to a minimum. Also since the preferred method is to use the instrument in groups of 3 or more a common output viewing unit provides a significant cost saving.

The digital data output at terminal 19 can be used to transfer the stored data to a permanent, non-volatile storage medium such as paper or magnetic tape. A digital cassette tape recorder 23 is a suitable unit for this purpose. The data transfer to the recorder 23 can be initiated manually as an alternative, or in addition, to viewing the recording on an oscilloscope, or it can be automatic. In the automatic mode the recorder 23 records the data from memory 15, together with a date and time reference, every time the trigger unit 20 is triggered and then re-arms itself ready for the next trigger. For this purpose, a tape recorder control 24 is operated by the trigger unit 20. This method of operation is particularly useful for recording transitory faults.

The digital data at terminal 19 can also be used to measure the amplitude of any point on the waveform produced at terminal 18. For this purpose, the synchronising signal at terminal 22 and an output clock signal from control unit 13 at a terminal 25 is fed into an external "interrogation" unit 26 which generates a pulse coincident with the appearance at both outputs 18 and 19 of the data at any selectable point in the recording. The pulse is fed to the oscilloscope, as shown at 27, to provide a marker on the oscilloscope trace and also latches the digital data at terminal 19 into a binary to binary-coded-decimal converter 28 for display on a numerical indicator 29. The digital "interrogation" unit 26 avoids any problems with non-linearity in both the digital-to-analogue converter 17 and the oscilloscope deflection amplifier. It also enables simple and accurate comparison of voltage levels at similar "points-on-wave" of any of the cycles of the recorded waveform, independent of the linearity of the oscilloscope timebase.

The trigger unit 20 has a selector switch 30 for selecting any one of a number of different trigger circuits in the unit 20. These enable the apparatus to be triggered in a variety of ways, including pre-set timers, tele-control links or, preferably, changes in the state of the supply being monitored. Typically an instrument has three basic modes of triggering. First, the "Off to On". mode in which it is triggered by the voltage which appears when a cable is re-energised. This voltage may last for only a short period of time if the fault is a low impedance short circuit, or it may last for many cycles if the fault has an arcing characteristic. The instrument is therefore set so that appearance of the voltage does not stop the recording operation until approximately 9 cycles later so that the stored waveform contains 10% pre-trigger information and 90% post-trigger information as illustrated in FIG. 4a. In the second, "On to Off" mode, the trigger circuit is operated if the cable becomes de-energised for more than 1 cycle. In this mode the recording is stopped immediately so that the stored waveform consists of approximately 90% pre-trigger and 10% post-trigger information as illustrated in FIG. 4b. When the instrument is switched to the "On to Off" mode it will only record when a supply failure occurs and therefore it can be connected when the cable is un-energised so that when the cable is subsequently re-energised it will record a waveform irrespective of whether the supply fails within half a cycle, half a second or half a day. Since the behaviour of low voltage cable faults is so unpredictable the "On to Off" mode of operation is probably the most useful, and the most reliable, since complete failure of the supply is a more positive condition than any transitory disturbance.

However, transitory breakdowns often provide an extremely useful method for locating a fault, particularly if the fuse operations are very infrequent. The instrument, therefore, has a third trigger setting, the "Transitory" mode. In this position the trigger circuit is fed via a 50 Hz rejection filter so that only transient disturbances are detected. In the "transitory" mode the instrument is arranged to provide 10% pre-trigger and 90% post-trigger information so that it will not miss any further transitory breakdowns, or fuse operations, which occur in the 9 cycles following the initial transitory fault. Combining the operation of the "On to Off" and "Transitory" triggers is a useful way of increasing the versatility of the instrument.

The apparatus of the present invention, in one embodiment, detects a transient by determining the instantaneous difference between the voltage during the passage of fault current and the voltage which would have been present had the fault not occurred. In the equipment the 'difference' signal is obtained by using a 50Hz rejection filter which produces an output resembling the required signal as shown in FIG. 7. In this figure, the upper graph shows the input signal; it will be seen, over nearly a quarter of a cycle, the amplitude is at a low and approximately constant level due to a fault. The lower graph shows the output of the filter and, in dashed lines, the difference signal. The filter output, within a few microseconds of the initial edge of the fault signal, closely approximates to the difference signal. This output is used to give the trigger signal.

Various refinements of the transient detector circuit are possible, for example, it can be arranged to be sensitive only to depressions of the supply voltage so that voltage spikes, due to switching inductive loads, are not recorded unnecessarily. When several instruments are used to monitor a transitory fault it is essential to know that they have all recorded the same disturbance, therefore the date and time of the recording must also be stored. This is obtained from a time and date unit 31. Details of the times at which recordings were made is essential when the information is being automatically transferred to an external device such as a digital tape cassette of recorder 23.

For recording data, a portable battery-operated unit comprising components 10–17 and 20 is connected to a mains cable, conveniently by use of a plug at input terminal 10 which can be plugged into a supply outlet socket on a consumer's premises. Provision may be made for trickle-charging the battery of the battery-operated unit when a mains power supply is available.

The instrument can be used in a variety of ways but the simplest method is to use three such battery-powered units to record the voltages at (i) the feeding substation, (ii) the most distant accessible point on the cable and (iii) any conveniently accessible intermediate point. The instruments are generally connected between the live and neutral/earth conductors. It does not matter if the fault develops between two phases, provided the instruments are connected to one of the affected phases. The data is stored in memory 15 and is subsequently analysed. In some cases the recorder 23 and its associated circuit may also be used so as to store information on a succession of transient faults. FIG. 5 at 32, 33 and 34 shows the waveforms appearing at various points along a cable during a typical fault re-energisation. The initial objective is to determine whether the intermediate recorder is connected between the substation and the fault, or on the opposite side of the fault to the substation. Recordings obtained beyond the fault will be identical in shape to the recording obtained at the furthest point of the system although there may be some slight differences in amplitude if there is any load connected to the cable beyond the fault. All the wveforms obtained at, or beyond, the fault are identical in shape to the voltage across the fault itself. By comparison, recordings obtained between the substation and the fault will not be identical in shape to the "fault" voltage. Thus it is possible to sectionalise the fault position by simple qualitative analysis of the waveforms. The use of more than three recorders can often save time by avoiding the need to move the intermediate recorder about. If an intermediate recorder is connected between the fault and the substation the fault position can be located by using the familiar voltage gradient technique.

Figure 6:
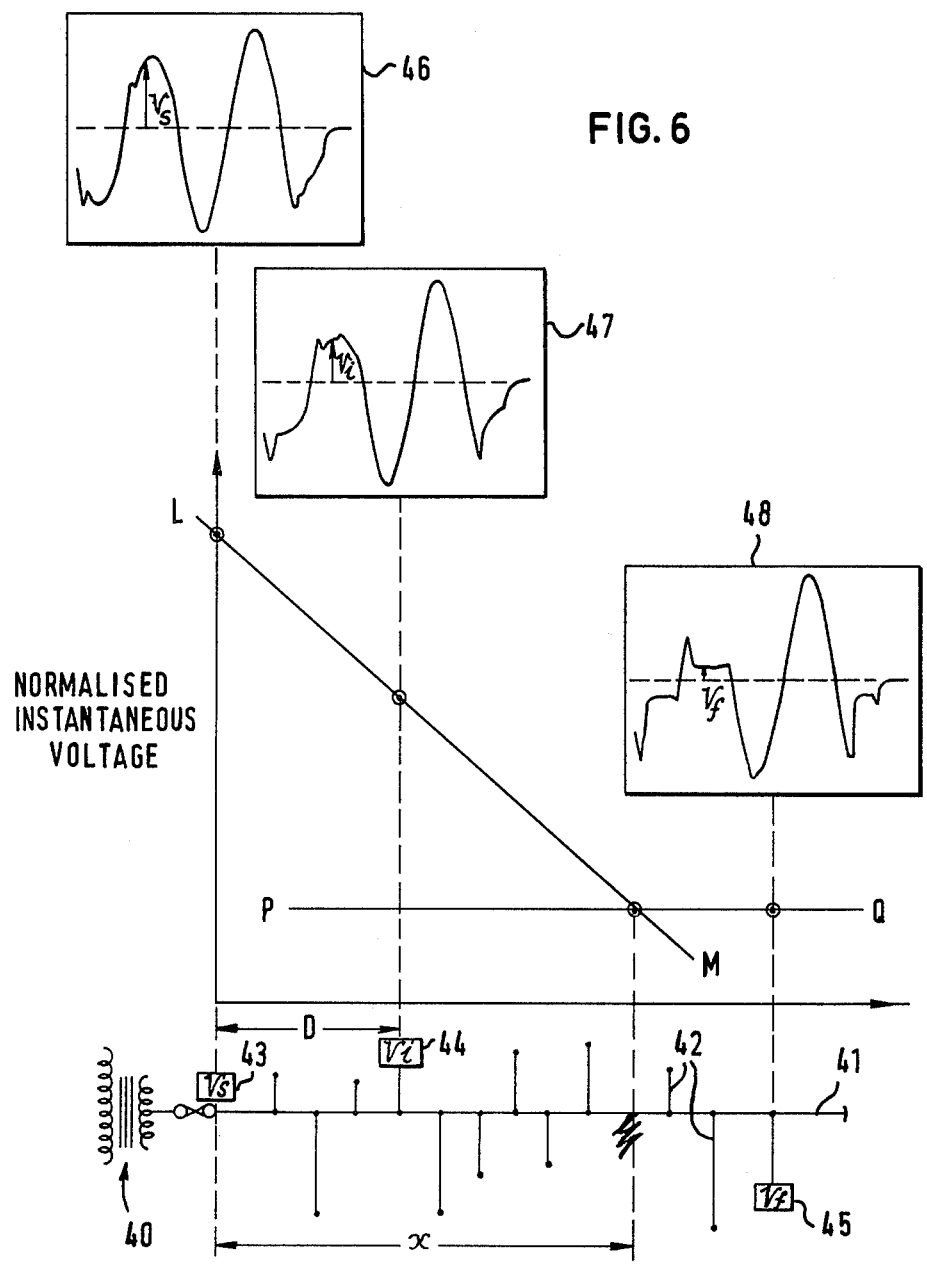
FIG. 6 is a diagram to explain the location of a fault from a voltage gradient profile.

In analysing the data, the waveforms obtained on all the instruments must first be synchronised by reference to some identifiable point on the recordings, e.g. time of fuse clearance. From the recorded voltage waveforms it is possible to see when the fault current was flowing and then a set of instantaneous voltage levels can be determined to produce a voltage gradient profile. The interrogation unit 26 enables the required amplitudes to be selected and displayed numerically on display 29. To reduce the effect of any connected loads the voltages obtained at each point should be "normalised" by dividing each of them with the voltage recorded at the point when no fault current was flowing. This process also has the effect of overcoming any unintentional differences in the sensitivities of the recorders. The readings from the instruments connected on the substation side of the fault are used to give the voltage gradient up to the fault, while the readings from instruments on the far side of the fault are used to give the fault voltage itself, thereby locating the fault point as illustrated in FIG. 6. In the lower part of this figure, there is shown diagrammatically a supply source 40 feeding a cable 41 having a number of branches 42. A fault is present at a point X which is at a distance X from the supply source. Recorders 43, 44 and 45 at the supply source and at two further points along the cable, one of which is beyond the fault. The recorded waveforms are shown at 46, 47 and 48 respectively. The instantaneous amplitudes at corresponding points in the waveforms, when fault current is flowing, are $V_s$, $V_i$ and $V_f$ respectively and these are plotted as ordinates in the graphical diagram in the center part of FIG. 6. The abscissa of the graph only represents distance if the cable cross-section between the substation and the fault is constant. If more than one cable type is present it is necessary to use "equivalent" lengths. The line LM shows the voltage gradient in the cable between the source and the fault. Where this intersects the horizontal PQ through $V_f$ gives the fault location.

It is readily apparent that $$x = \frac{V_s - V_f}{V_s - V_i} \cdot D$$

where D is the equivalent length of cable between 43 and 44.

It is possible to obtain a reasonably accurate, though often ambiguous location from a single recording taken in the substation. In general this entails an extremely complex calculation due to the non-sinusoidal fault current which flows in the three non-linear circuit elements - the transformer, the cable and the fault. It is also necessary to record all three phase voltages to take account of possible core to core faults. A three channel version of the recorder is thus required and it is essential that it has a digital output so that the recorded data can be analysed in a computer.

A low power battery-operated digital transient recorder described above can be used for locating low voltage cable faults. The instrument can be used to locate transitory, non-persistent and permanent faults. As described above, the instrument is generally used in groups of three or more and the fault position is determined by obtaining a voltage gradient profile. Because the instruments store complete waveforms it is possible to ensure that the voltage gradient is only obtained when fault current is flowing. The instrument provides an analogue output for viewing the recording on an oscilloscope and a digital output for transferring data to an external storage device, such as a digital tape cassette. The digital output is also used with an external unit which enables the analogue display on the oscilloscope to be "interrogated" digitally, thereby avoiding errors in any measurements arising from non-linearities in the oscilloscope amplifier or timebase.

If the equipment is used on a cable known to have a fault of a non-persistent nature it may be possible to locate it before further fuse operations have occurred, provided that at least one transitory breakdown takes place. Since the equipment can also detect and locate transitory faults on cables it should enable many damaged cables to be identified and repaired before a non-persistent, or permanent fault develops and causes an unplanned interruption of supplies.

I claim:

1. A method of detecting a transitory or non-persistent fault in an electric cable carrying a low frequency electric current comprising, at each of a number of spaced points along the cable, sensing the transient changes in the voltage waveform between a pair of conductors using a filter for rejecting said low frequency, utilising the sensed transient at each of said second points to trigger a transient recorder at that point to record the voltage on said cable over a predetermined period having a duration of a few cycles at said low frequency both immediately before and immediately after the sensing of said transient changes, each of the recorders including an analogue-to-digital converter and having means for holding the digital output, and simultaneously recording time reference data in each recorder whereby the information recorded by the separate recorders is correlatable, and subsequently interrogating the recorded data to determine the amplitudes of the waveforms at corresponding time instants at the various spaced points, and determining the location of the fault on the cable from the voltage gradient.

2. A method as claimed in claim 1 wherein data is recorded at two points on the cable between the supply and the fault and at one point beyond the fault and wherein the amplitudes of corresponding points in the waveform, at a time when fault current is flowing, are extracted to determine the potential gradient between the supply and the fault and to thereby locate the position of the fault along the length of the cable.

3. A method of detecting a transitory or non-persistent fault in a multi-conductor electric power cable carrying a low frequency electric current comprising the steps of utilising, at each of a number of spaced points along the cable, battery-powered sensing apparatus to sense the transient changes in the voltage waveform between a pair of conductors using a filter to reject said low frequency, deriving a trigger signal from the sensed transient, utilising the sensed trigger signal to operate battery-powered transient recording apparatus to record, in digital form, successive amplitudes defining the waveform at each of said points over a period of a few cycles at said low frequency immediately before and immediately after the sensed trigger signal, recording time reference data simultaneously with each digitised waveform record whereby the various records at the different points are correlatable, and subsequently interrogating the recorded to determine the relative amplitudes of the waveforms at corresponding time instants at each of the spaced points, and determining the location of the fault on the cable from the voltage gradient.

* * * * *